(12) United States Patent
Yamaguchi et al.

(10) Patent No.: US 9,838,028 B1
(45) Date of Patent: Dec. 5, 2017

(54) A/D CONVERSION CIRCUIT

(71) Applicant: ROHM CO., LTD., Ukyo-ku, Kyoto (JP)

(72) Inventors: Haruhisa Yamaguchi, Kyoto (JP); Kinji Ito, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 0 days.

(21) Appl. No.: 15/595,106

(22) Filed: May 15, 2017

(30) Foreign Application Priority Data

May 17, 2016 (JP) ................................ 2016-099002

(51) Int. Cl.
| | |
|---|---|
| *H03M 1/10* | (2006.01) |
| *H03M 1/06* | (2006.01) |
| *H01L 27/02* | (2006.01) |
| *H03M 1/34* | (2006.01) |
| *H03M 1/12* | (2006.01) |
| *H03M 1/00* | (2006.01) |
| *H03M 1/78* | (2006.01) |

(52) U.S. Cl.
CPC .......... *H03M 1/1076* (2013.01); *H01L 27/02* (2013.01); *H03M 1/0602* (2013.01); *H03M 1/0697* (2013.01); *H03M 1/34* (2013.01); *H03M 1/00* (2013.01); *H03M 1/12* (2013.01); *H03M 1/1225* (2013.01); *H03M 1/785* (2013.01)

(58) Field of Classification Search
CPC ........ H03M 1/12; H03M 1/00; H03M 1/1225; H03M 1/785
USPC .................. 341/120, 118, 121, 141, 154, 155
See application file for complete search history.

(56) References Cited

U.S. PATENT DOCUMENTS

2008/0278359 A1\* 11/2008 Wojewoda .......... H03M 1/1028
341/141

FOREIGN PATENT DOCUMENTS

| JP | 2014014029 A | 1/2014 |
|---|---|---|
| JP | 2015102318 A | 6/2015 |

\* cited by examiner

*Primary Examiner* — Joseph Lauture
(74) *Attorney, Agent, or Firm* — Cantor Colburn LLP

(57) ABSTRACT

An A/D conversion circuit includes a reference voltage source to generate a calibration voltage, a multiplexer to receive an analog signal and the calibration voltage, and output the analog signal selected in a normal mode and the calibration voltage selected in a calibration mode or a self-diagnosis mode, an A/D converter to convert an output signal from the multiplexer into a digital signal, a non-volatile memory to hold the digital signal and calibration data, a digital calibration part to calibrate the digital signal in case of inputting the analog signal to the A/D converter in the normal mode based on the calibration data, and a self-diagnosis circuit to diagnose the A/D converter based on the digital signal in case of inputting the calibration voltage to the A/D converter in the self-diagnosis mode, and the digital signal stored in the non-volatile memory.

17 Claims, 5 Drawing Sheets

A/D CONVERSION CIRCUIT

CROSS-REFERENCE TO RELATED APPLICATION(S)

This application is based upon and claims the benefit of priority from Japanese Patent Application No. 2016-099002, filed on May 17, 2016, the entire contents of which are incorporated herein by reference.

TECHNICAL FIELD

The present disclosure relates to an A/D conversion circuit.

BACKGROUND

An A/D converter has been used to detect an electrical state of an internal circuit or a physical state of an electronic device for digital signal processing and convert an analog signal indicative of these states into a digital signal.

As a result of reviewing A/D conversions, the present inventors have recognized the following problems.

When an A/D converter is completely broken down and becomes inoperable, a digital signal does not correlate with an analog signal. In this case, it is possible to recognize an abnormality in a processor or a circuit at a subsequent stage that uses an output signal from the A/D converter.

However, incomplete deterioration or failure (hereinafter, referred to as "incomplete deterioration") may occur in the A/D converter due to a secular change. The term "incomplete deterioration" refers to a failure mode in which an abnormality has occurred but the A/D converter operates at a glance and a certain output signal, although inaccurate, is generated. When an incomplete failure occurs, the subsequent processor or circuit operates according to an erroneous output signal, which causes malfunction of a system.

SUMMARY

The present disclosure provides some embodiments of an A/D converter capable of detecting a change in characteristics over time.

According to one embodiment of the present disclosure, there is provided an A/D conversion circuit. The A/D conversion circuit includes: a reference voltage source configured to generate a predetermined calibration voltage; a multiplexer configured to receive an analog signal and the calibration voltage and output the analog signal selected in a normal mode and the calibration voltage selected in a calibration mode or a self-diagnosis mode; an A/D converter configured to convert an output signal from the multiplexer into a digital signal; a non-volatile memory configured to hold the digital signal in case of inputting the calibration voltage to the A/D converter in the calibration mode, and calibration data calculated based on the digital signal; a digital calibration part configured to calibrate the digital signal in case of inputting the analog signal to the A/D converter in the normal mode based on the calibration data; and a self-diagnosis circuit configured to diagnose the A/D converter based on the digital signal in case of inputting the calibration voltage to the A/D converter in the self-diagnosis mode, and the digital signal stored in the non-volatile memory.

According to the present embodiment, it is possible to detect a change in characteristics of the A/D converter.

Two values of a maximum voltage corresponding to a maximum value of the digital signal and a minimum voltage corresponding to a minimum value of the digital signal may be selectable as the calibration voltage. A digital signal in case of inputting the maximum voltage to the A/D converter and a digital signal in case of inputting the minimum voltage to the A/D converter are stored in the non-volatile memory.

In this case, since the comparison can be performed at two points, it is possible to detect a change in characteristics of the A/D converter in more detail.

A middle voltage corresponding to a middle point between the maximum value and the minimum value of the digital signal may be selectable as the calibration voltage, and a digital signal in case of inputting the middle voltage to the A/D converter is stored in the non-volatile memory.

The A/D converter may include a $\Delta\Sigma$ A/D converter. The self-diagnosis circuit may be configured to store an output signal from a quantizer of the $\Delta\Sigma$ A/D converter in the self-diagnosis mode into the non-volatile memory.

The output signal from the quantizer of the $\Delta\Sigma$ A/D converter may have a bit length of about 1 to 8 bits, which may be held as continuous data so as to be read and used for fast Fourier transform (FFT) interpretation later. Thus, it is possible to investigate a failure and deterioration situation in more detail.

The A/D conversion circuit may further include a timer circuit configured to generate a signal to trigger the self-diagnosis mode.

The A/D conversion circuit may be switched into the self-diagnosis mode in response to an external trigger signal.

The self-diagnosis circuit may be configured to write the digital signal obtained in the self-diagnosis mode in the non-volatile memory. By leaving the history in the non-volatile memory, it is possible to investigate the progress of deterioration of the A/D converter.

The A/D conversion circuit may further include a variable gain amplifier whose gain is settable and which amplifies the output signal from the multiplexer. Since an appropriate gain is set according to the range of an analog signal, it is possible to provide a general purpose property to be used in various applications.

The analog signal and the calibration voltage may be differential signals, and the A/D converter may be a differential type.

The A/D conversion circuit may further include a calculation part configured to calculate the calibration data in the calibration mode.

According to another embodiment of the present disclosure, there is provided an A/D conversion circuit. The A/D conversion circuit includes: a reference voltage source configured to generate a predetermined calibration voltage; a multiplexer configured to receive an analog signal and the calibration voltage and output the analog signal selected in a normal mode and the calibration voltage selected in a calibration mode or a self-diagnosis mode; an A/D converter configured to convert an output signal from the multiplexer into a digital signal; a calculation part configured to calculate calibration data based on the digital signal in case of inputting the calibration voltage to the A/D converter in the calibration mode and the self-diagnosis mode; a non-volatile memory configured to store the calibration data obtained in the calibration mode; a digital calibration part configured to calibrate the digital signal in case of inputting the analog signal to the A/D converter in the normal mode based on the calibration data; and a self-diagnosis circuit configured to diagnose the A/D converter based on the calibration data generated by the calculation part in the self-diagnosis mode and the calibration data stored in the non-volatile memory.

According to the present embodiment, it is possible to detect a change in characteristics of the A/D converter based on a history of the calibration data.

The A/D conversion circuit may be integrated on a single semiconductor substrate. The term "integrated" may include a case where all the components of a circuit are formed on a semiconductor substrate or a case where major components of a circuit are integrated, and some resistors, capacitors or the like may be installed outside the semiconductor substrate in order to adjust circuit constants. By integrating the circuit on a single chip, it is possible to reduce the circuit area and to uniformly maintain the characteristics of the circuit element.

Further, arbitrarily combining the foregoing components or substituting the components or expressions of the present disclosure with one another among a method, an apparatus, and a system is also effective as an embodiment of the present disclosure.

DETAILED DESCRIPTION

Figure 1:
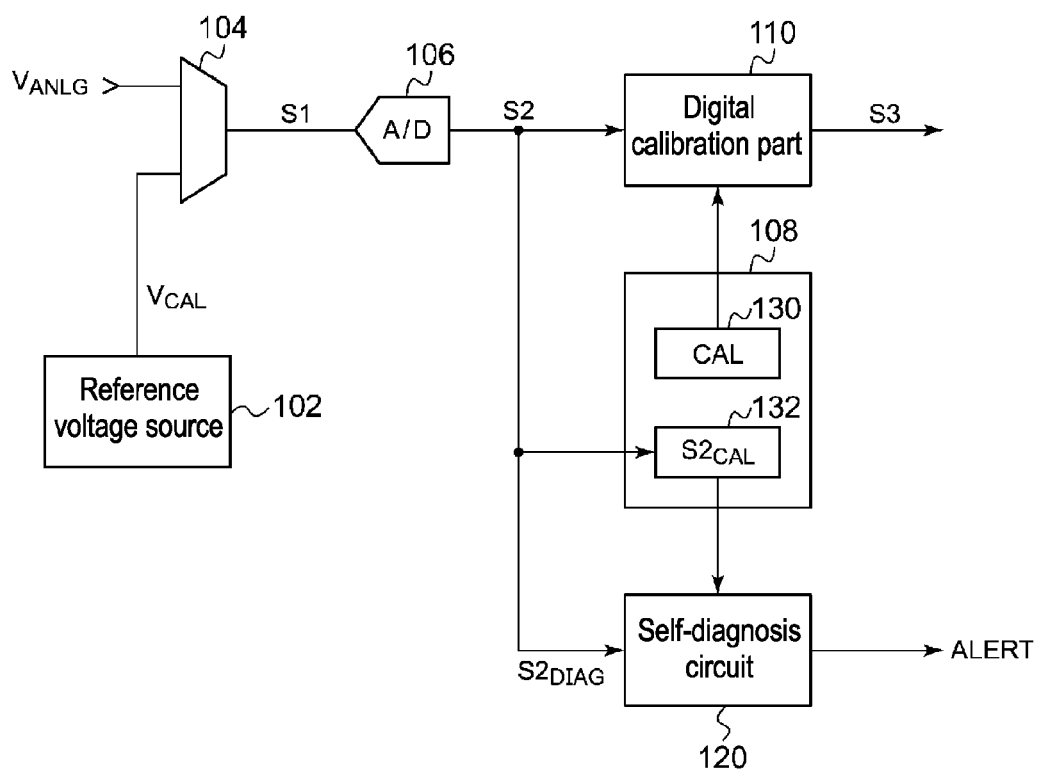
FIG. 1 is a block diagram of an A/D conversion circuit according to an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B.

Similarly, "a state where a member C is installed between a member A and a member B" includes a case where the member A and the member C or the member B and the member C are indirectly connected through any other member that does not affect an electrical connection state between the members A and C or the members B and C, in addition to a case where the member A and the member C or the member B and the member C are directly connected.

FIG. 1 is a block diagram of an A/D conversion circuit 100 according to an embodiment of the present disclosure. The A/D conversion circuit 100 includes a reference voltage source 102, a multiplexer 104, an A/D converter 106, a non-volatile memory 108, a digital calibration part 110, and a self-diagnosis circuit 120.

The A/D conversion circuit 100 operates in three modes of a normal mode, a calibration mode, and a self-diagnosis mode. In the normal mode, the A/D conversion circuit 100 receives an analog signal $V_{ANLG}$ to be measured and outputs a digital signal S3 representing its magnitude. The calibration mode is performed before the A/D conversion circuit 100 is released or a product equipped with the A/D conversion circuit 100 is released, so that the input/output characteristics of the A/D converter 106 becomes close to an ideal state. The self-diagnosis mode is executed after a product equipped with the A/D conversion circuit 100 is released, to detect a change in characteristics of the A/D converter 106.

The reference voltage source 102 generates a predetermined calibration voltage $V_{CAL}$. The calibration voltage $V_{CAL}$ is used in the calibration mode or the self-diagnosis mode. The multiplexer 104 receives the analog signal $V_{ANLG}$ and the calibration voltage $V_{CAL}$, and outputs the analog signal $V_{ANLG}$ selected in the normal mode and the calibration voltage $V_{CAL}$ selected in the calibration mode or the self-diagnosis mode.

The A/D converter 106 converts an output signal S1 from the multiplexer 104 into a digital signal S2.

The non-volatile memory 108 holds calibration data 130 calculated according to a digital signal $S2_{CAL}$ when the calibration voltage $V_{CAL}$ is input to the A/D converter 106 in the calibration mode.

The digital calibration part 110 calibrates the digital signal S2 in case of inputting the analog signal $V_{ANLG}$ to the A/D converter 106 in the normal mode, based on the calibration data 130, to output the digital signal S3.

The non-volatile memory 108 stores the calibration data 130 and the digital signal $S2_{CAL}$ in case of inputting the calibration voltage $V_{CAL}$ to the A/D converter 106 in the calibration mode as reference data 132.

The self-diagnosis circuit 120 diagnoses the A/D converter 106 based on the digital signal $S2_{DIAG}$ when the calibration voltage $V_{CAL}$ is input to the A/D converter 106 in the self-diagnosis mode and the reference data 132 (digital signal $S2_{CAL}$) stored in the non-volatile memory 108.

For example, when a difference between the two digital signals $S2_{DIAG}$ and $S2_{CAL}$ exceeds a threshold value, the self-diagnosis circuit 120 may output an alert ALERT. Alternatively, the difference of the two digital signals may be written in an externally accessible register and specific processing and determination may be performed by an external microcomputer or the like.

Further, when the ratio of the two digital signals $S2_{DIAG}$ and $S2_{CAL}$ exceeds a predetermined value, the self-diagnosis circuit 120 may output an alert ALERT. Alternatively, the ratio of the two digital signals may be written in an externally accessible register and specific processing and determination may be performed by an external microcomputer or the like.

The above is the configuration of the A/D conversion circuit 100. Next, an operation thereof will be described based on some examples.

First Embodiment

Figure 2A:
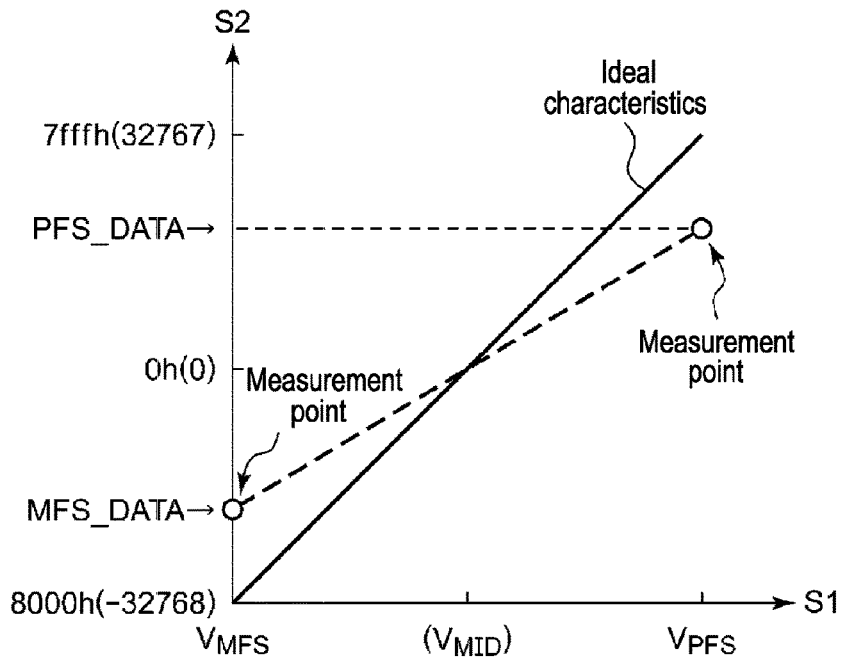
FIGS. 2A and 2B are diagrams illustrating an operation of the A/D conversion circuit according to a first example.
Figure 2B:
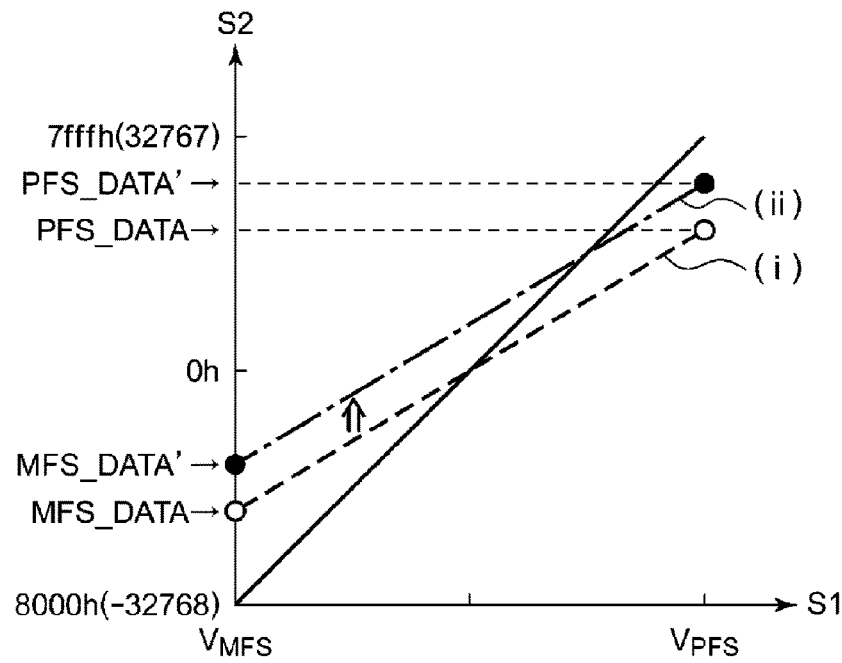

FIGS. 2A and 2B are diagrams illustrating an operation of the A/D conversion circuit 100 according to a first embodiment. FIG. 2A is a diagram for explaining calibration. In the calibration of FIG. 2A, two values of a maximum voltage $V_{PFS}$ corresponding to a maximum value (plus full scale (PFS)) of the digital signal S2 and a minimum voltage $V_{MFS}$ corresponding to a minimum value (minus full scale (MFS)) of the digital signal S2 are selectively switched as the calibration voltage $V_{CAL}$.

A value (code) PFS_DATA of the digital signal S2 when the maximum voltage $V_{PFS}$ is input to the A/D converter 106 and a value (code) MFS_DATA of the digital signal S2 when the minimum voltage $V_{MFS}$ is input thereto are measured. Here, h is a hexadecimal notation and the number in the bracket is a decimal notation.

Subsequently, a gain error calibration factor $\alpha$ is calculated by Eq. (1). NUM_FS is the number of gradations of a full scale.

$$\alpha = \text{NUM\_FS}/(\text{PFS\_DATA}-\text{MFS\_DATA}) = 10000h \\ (65536)/(\text{PFS\_DATA}-\text{MFS\_DATA}) \quad \text{Eq. (1)}$$

Further, an offset calibration factor $\beta 1$ is calculated by Eq. (2).

$$\beta 1 = (\text{PFS\_DATA}+\text{MFS\_DATA})/2 \quad \text{Eq. (2)}$$

The obtained gain error calibration factor $\alpha$ and the offset calibration factor $\beta 1$ are stored as the calibration data 130 in the non-volatile memory 108. Further, the calculation of the calibration data 130 is performed outside the A/D conversion circuit 100 based on Eqs. (1) and (2).

The two data PFS_DATA and MFS_DATA, which are the digital signal $S2_{CAL}$ and obtained during the calibration, are also stored as the reference data 132 in the non-volatile memory 108.

In the normal mode, the digital calibration part 110 performs calculation of Eq. (3) on a value ADC_DATA of the digital signal S2 obtained as a result of the conversion of the analog signal $V_{ANLG}$, and generates calibrated data ADC_CAL (digital signal S3).

$$\text{ADC\_CAL} = (\text{ADC\_DATA} - \beta 1) \times \alpha \quad \text{Eq. (3)}$$

FIG. 2B is a diagram for explaining the self-diagnosis. The input/output characteristics of the A/D converter 106 are changed from the broken line (i) obtained during calibration to the alternate long and short dash line (ii) due to a secular change.

In the self-diagnosis mode, the reference voltage source 102 uses at least one or both of the calibration voltage $V_{CAL}$, i.e., the maximum voltage $V_{PFS}$ and the minimum voltage $V_{MFS}$, which are used in the calibration mode. For example, the maximum voltage $V_{PFS}$ is input to the A/D converter 106 to measure a value PFS_DATA' of the digital signal $S2_{DIAG}$ at that time. Then, the value PFS_DATA' is compared with the value PFS_DATA of the reference data 132 stored in the non-volatile memory 108 to thereby detect a change in characteristics of the A/D converter 106.

Further, the minimum voltage $V_{MFS}$ is input to the A/D converter 106 and a value MFS_DATA' of the digital signal $S2_{DIAG}$ is measured at that time. Then, the value MFS_DATA' is compared with the value MFS_DATA of the reference data 132 stored in the non-volatile memory 108 to thereby detect a change in characteristics of the A/D converter 106.

In the self-diagnosis mode, both of the values FPS_DATA' and MFS_DATA' may be measured. The self-diagnosis circuit 120 may detect a change in characteristics of the A/D converter 106 based on a comparison between (PFS_DATA'-MFS-DATA') and (PFS_DATA-MFS_DATA) obtained from the reference data 132.

Alternatively, self-diagnosis circuit 120 may detect a change in characteristics of the A/D converter 106 based on a comparison between (PFS_DATA'+MFS-DATA') and (PFS_DATA+MFS_DATA) obtained from the reference data 132.

Second Embodiment

Figure 3A:
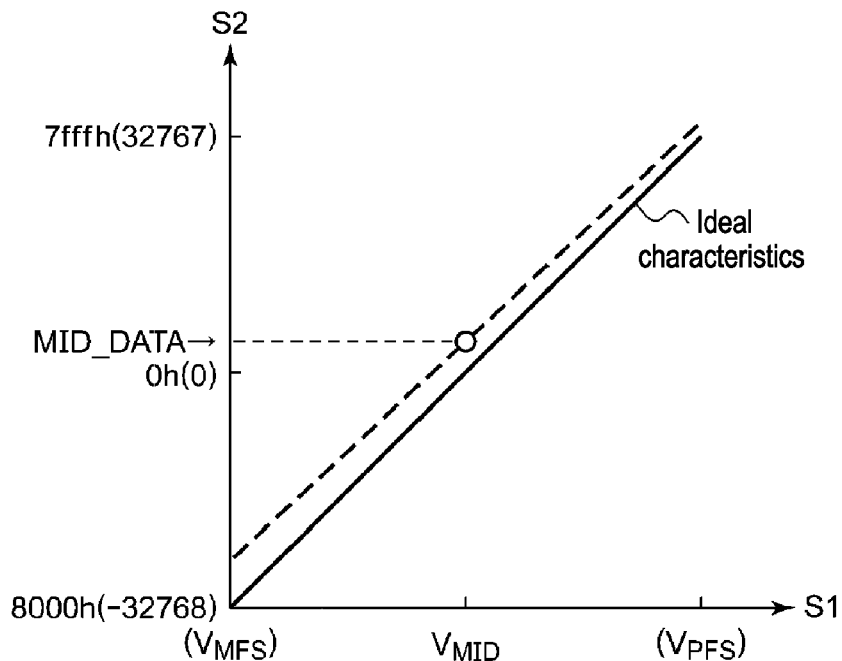
FIGS. 3A and 3B are diagrams illustrating an operation of the A/D conversion circuit according to a second example.
Figure 3B:
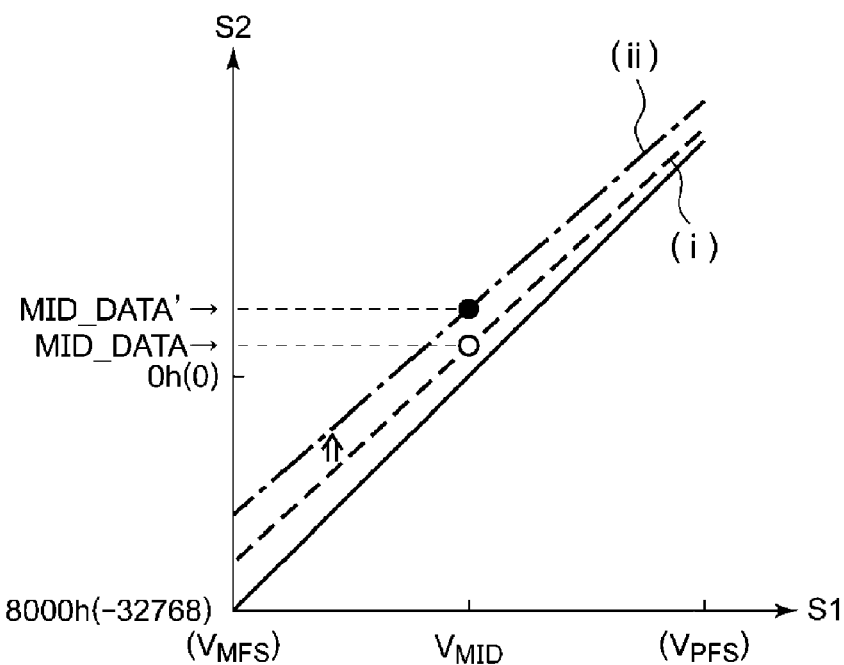

FIGS. 3A and 3B are views illustrating an operation of the A/D conversion circuit 100 according to a second embodiment. FIG. 3A is a diagram for explaining the calibration. In the calibration of FIG. 3A, a middle voltage $V_{MID}$ corresponding to a middle point MID between a maximum value PFS and a minimum value MFS of the digital signal S2 is selected as the calibration voltage $V_{CAL}$.

Subsequently, a value (code) MID_DATA of the digital signal S2 is obtained when the middle voltage $V_{MID}$ is input to the A/D converter 106.

At this time, an offset calibration factor $\beta 2$ may be obtained from Eq. (4).

$$\beta 2 = \text{MID\_DATA} \quad \text{Eq. (4)}$$

The obtained offset calibration factor $\beta 2$ is stored as the calibration data 130 in the non-volatile memory 108. In the second embodiment, the gain error calibration factor $\alpha$ is not calculated. The data MID_DATA, which is the digital signal $S2_{CAL}$ and obtained during the calibration, is stored as the reference data 132 in the non-volatile memory 108.

In the normal mode, the digital calibration part 110 performs calculation of Eq. (5) on the value ADC_DATA of the digital signal S2 obtained as a result of the conversion of the analog signal $V_{ANLG}$ and generates calibrated data ADC_CAL.

$$\text{ADC\_CAL} = (\text{ADC\_DATA} - \beta 2) \quad \text{Eq. (5)}$$

FIG. 3B is a diagram for explaining the self-diagnosis. The input/output characteristics of the A/D converter 106 are changed from the broken line (i) obtained during the calibration to the alternate long and short dash line (ii) due to a secular change. In the self-diagnosis mode, the reference voltage source 102 uses the calibration voltage $V_{CAL}$, i.e., the middle voltage $V_{MID}$, which is used in the calibration mode. Specifically, the middle voltage $V_{MID}$ is input to the A/D converter 106 and a value MID_DATA' of the digital signal $S2_{DIAG}$ can be obtained at that time. Then, the value MID_DATA' is compared with the value MID_DATA of the reference data 132 stored in the non-volatile memory 108 to thereby detect a change in characteristics of the A/D converter 106.

Third Embodiment

The first embodiment and the second embodiment may be combined. That is, in the calibration mode, measurements are performed at three points of the maximum voltage $V_{PFS}$, the middle voltage $V_{MID}$, and the minimum voltage $V_{MFS}$ to calculate a gain error calibration factor $\alpha$ and offset calibration factors $\beta 1$ and $\beta 2$. In the normal mode, the digital calibration part 110 generates calibrated data ADC_CAL based on Eq. (3) or Eq. (6). It may be selectable which one is used.

$$\text{ADC\_CA} = (\text{ADC\_DATA} - \beta 2) \times \alpha \quad \text{Eq. (6)}$$

The self-diagnosis process may be combined with the method described in the first or second example.

The above is the operation of the A/D conversion circuit 100. According to the A/D conversion circuit 100, it is possible to detect a change in characteristics of the A/D converter 106 due to aged deterioration. Further, when an unacceptable characteristic change occurs in the A/D converter 106, it is possible to take measures such as notifying a user about a failure or urging maintenance. Thus, it is possible to prevent a device or a system equipped with the A/D conversion circuit 100 from continuously operating based on the erroneous digital signal S3, and to improve the reliability of the device or system.

The present disclosure may extend to various devices and circuits that may be recognized by the block diagram or the circuit diagram of FIG. 1 or derived from the above description, but is not limited to the specific configuration. Hereinafter, a more specific configuration example and embodiment will be described in order to help understand and clarify the essence of the present disclosure and a circuit operation thereof, rather than to narrow the scope of the present disclosure.

Figure 4:
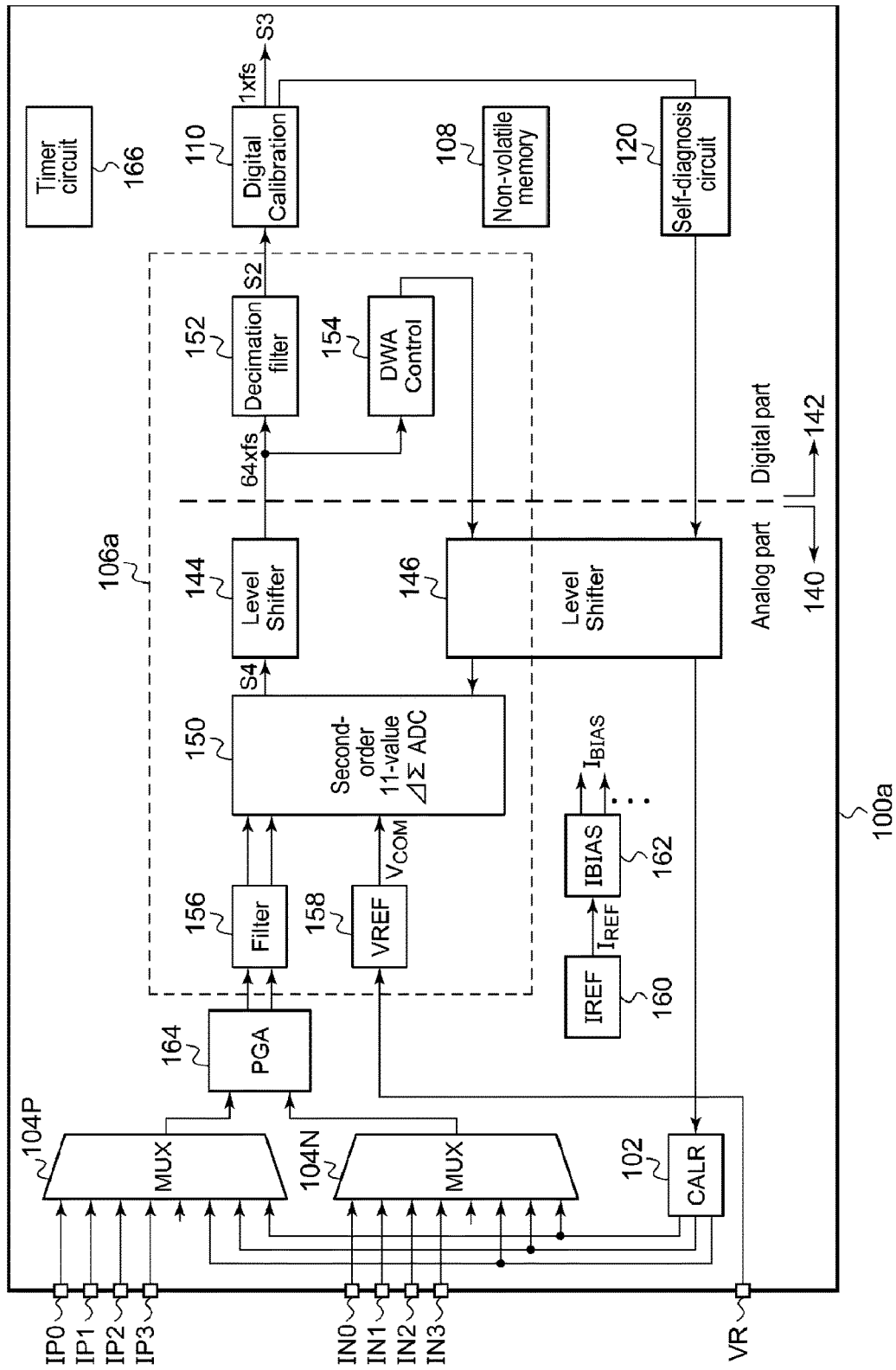
FIG. 4 is a circuit diagram of a specific configuration example of the A/D conversion circuit.

FIG. 4 is a circuit diagram of a specific configuration example 100a of the A/D conversion circuit. The A/D conversion circuit 100a is used for a high precision sensor and has a resolution of 16 to 24 bits as a whole. The A/D conversion circuit 100a is a functional integrated circuit (IC) integrated on a single semiconductor device.

The A/D conversion circuit 100a is roughly divided into an analog part 140 and a digital part 142. The front-stage portion of an A/D converter 106a belongs to the analog part 140 and the post-stage portion of the A/D converter 106a belongs to the digital part 142. Level shifters 144 and 146 are installed between the analog part 140 and the digital part 142.

A ΔΣ A/D converter 150 having a differential input is installed at an input stage of the A/D converter 106a. The ΔΣ A/D converter 150 is, for example, a second-order type and generates a multi-value signal S4 having 11 values of −5 to +5. The ΔΣ A/D converter 150 operates at a frequency of 64 times (or 32 times or 16 times) of a sampling frequency fs of the A/D converter 106a.

The multi-value signal S4, which is an output of the ΔΣ A/D converter 150, is level-shifted by the level shifter 144. A decimation filter 152 receives an output of the level shifter 144, which is output at 64×fs, down-samples the received output to the sampling frequency fs through a smoothing process, and converts a coarse signal of 11 values (equivalent to 3 to 4 bits) into a 24-bit high precision digital signal. A digital signal S3 of about 16 to 24 bits is finally generated through the calibration process by the digital calibration part 110 at the subsequent stage.

A digital weight average (DWA) controller 154 reduces the influence of element variations of a capacitive array type analog D/A converter installed in a feedback path within the ΔΣ A/D converter 150.

A noise filter 156 for suppressing switching noise is installed at a front stage of the ΔΣ A/D converter 150. Further, a reference voltage source 158 generates a common voltage $V_{COM}$ of the ΔΣ A/D converter 150.

A reference current source 160 generates a reference current $I_{REF}$. A bias circuit 162 is a current mirror circuit, which copies a reference current $I_{REF}$ to generate a bias current $I_{BIAS}$ and supplies the generated bias current $I_{BIAS}$ to each circuit block of the analog part 140 of the A/D converter 106.

The A/D conversion circuit 100a has plural (four) differential input ports IP/IN. Each of the differential input ports IP/IN is a pair of a positive-phase port IP and a negative-phase port IN. The multiplexer 104 includes a multiplexer 104P for selecting one of the plural positive ports IP0 to IP3 and a multiplexer 104N for selecting one of the negative-phase ports IN0 to IN3.

A variable gain amplifier 164 is installed at the front stage of the A/D converter 106a and amplifies differential output signals from the multiplexers 104P and 104N. A gain of the variable gain amplifier 164 is changeable depending on a set value of a register. Thus, it is possible to set an appropriate gain according to the range of an analog signal and to provide a general purpose property to be used in various applications.

The self-diagnosis circuit 120 of the A/D conversion circuit 100a may be activated in response to a trigger signal from an external personal microcomputer to be switched into a self-diagnosis mode.

The present disclosure has been described above based on the embodiment. It is to be understood by those skilled in the art that the embodiment is merely an illustrative example and may be differently modified by any combination of the components or processes, and the modifications are also within the scope of the present disclosure. Hereinafter, these modifications will be described.

(First Modification)

The A/D conversion circuit 100a of FIG. 4 may be provided with a timer circuit 166 built therein and configured to generate a signal that becomes a trigger of the self-diagnosis mode. Thus, the A/D conversion circuit 100a may periodically check a secular change of the A/D converter 106a.

(Second Modification)

In a case where the A/D conversion circuit 100a includes the ΔΣ A/D converter 150 as illustrated in FIG. 4, the self-diagnosis circuit 120 may store a bit stream (continuous data) of an output signal S4 from a quantizer of the ΔΣ A/D converter 150 in the non-volatile memory 108 in the self-diagnosis mode.

The output signal S4 from the quantizer of the ΔΣ A/D converter 150 may have a bit length of about 1 to 8 bits and may be held as the continuous data so as to be read and used for analysis later. For example, by performing fast Fourier transform (FFT) analysis, it is possible to investigate a failure and deterioration situation in more detail.

(Third Modification)

The self-diagnosis circuit 120 may write the digital signal $S2_{DIAG}$ obtained in the self-diagnosis mode into the non-volatile memory 108. That is, it is possible to investigate the progress of deterioration of the A/D converter by leaving the history of the digital signal $S2_{DIAG}$ whenever the self-diagnosis is executed.

(Fourth Modification)

Figure 5:
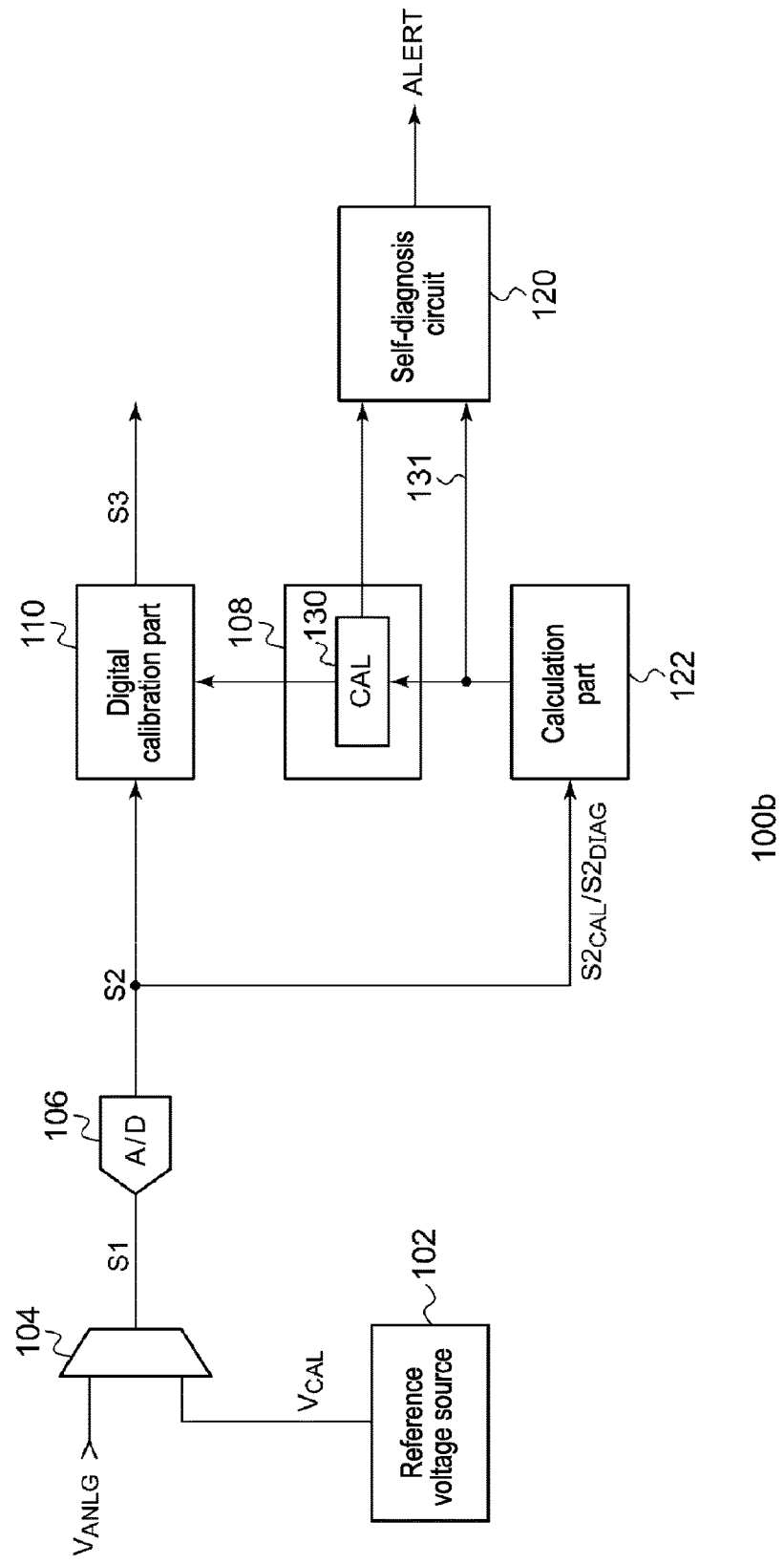
FIG. 5 is a circuit diagram of an A/D conversion circuit according to a fourth modification.

FIG. 5 is a circuit diagram of an A/D conversion circuit 100b according to a fourth modification. The A/D conversion circuit 100b includes a calculation part 122. The calculation part 122 calculates calibration data 130 based on the digital signal $S2_{CAL}$ when the calibration voltage $V_{CAL}$ is input to the A/D converter 106 in the calibration mode, and stores the calculated calibration data 130 in the non-volatile memory 108.

The calculation part 122 is also used in the self-diagnosis mode. That is, the calculation part 122 calculates calibration data 131 based on the digital signal $S2_{DIAG}$ when the calibration voltage $V_{CAL}$ is input to the A/D converter 106 in the self-diagnosis mode. The self-diagnosis circuit 120 diagnoses the A/D converter 106 based on the calibration data 131 generated by the calculation part 121 in the self-diagnosis mode and the calibration data 130 stored in the non-volatile memory 108.

The calibration data may be any combination of the gain error calibration factor α and the offset calibration factors β1 and β2. When output characteristics of the A/D converter 106 are changed due to aged deterioration, the calibration data is changed. Thus, it is possible to detect a change in characteristics of the A/D converter 106 by comparing the calibration data.

The calibration data 131 may be additionally written in the non-volatile memory 108. In this case, when operated in the normal mode after execution of self-diagnosis, the digital calibration part 110 may generate the digital signal S3 using the latest calibration data 131.

It is also be possible to combine the A/D conversion circuit 100b of FIG. 5 and the A/D conversion circuit 100 of FIG. 1.

(Fifth Modification)

The type of the A/D converter 106 is not limited to the ΔΣ A/D converter, and a successive approximation type or the like may be used.

The A/D converter 106 may be dependent upon temperature. In this case, the digital calibration part 110 may perform calibration in consideration of temperature.

(Sixth Modification)

FIG. 4 shows that the A/D conversion circuit 100a is integrated on a single IC but the present disclosure is not limited thereto. The parts except for the self-diagnosis circuit 120 in FIG. 1 may be integrated on a single IC and the self-diagnosis circuit 120 may be embodied by combining an external microcomputer and a software program. In this case, the IC may be configured to store the digital signal $S2_{DIAG}$, which may be obtained in the self-diagnosis mode, in a microcomputer-accessible register or non-volatile memory.

According to the present disclosure in some embodiments, it is possible to detect a change in characteristics over time.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An A/D conversion circuit, comprising:
a reference voltage source configured to generate a predetermined calibration voltage;
a multiplexer configured to receive an analog signal and the calibration voltage, and output the analog signal selected in a normal mode and the calibration voltage selected in a calibration mode or a self-diagnosis mode;
an A/D converter configured to convert an output signal from the multiplexer into a digital signal;
a non-volatile memory configured to hold the digital signal in case of inputting the calibration voltage to the A/D converter in the calibration mode, and calibration data calculated based on the digital signal;
a digital calibration part configured to calibrate the digital signal in case of inputting the analog signal to the A/D converter in the normal mode based on the calibration data; and
a self-diagnosis circuit configured to diagnose the A/D converter based on the digital signal in case of inputting the calibration voltage to the A/D converter in the self-diagnosis mode, and the digital signal stored in the non-volatile memory.

2. The A/D conversion circuit of claim 1, wherein two values of a maximum voltage corresponding to a maximum value of the digital signal and a minimum voltage corresponding to a minimum value of the digital signal are selectable as the calibration voltage, and
a digital signal in case of inputting the maximum voltage to the A/D converter and a digital signal in case of inputting the minimum voltage to the A/D converter are stored in the non-volatile memory.

3. The A/D conversion circuit of claim 2, wherein, when the digital signal in case of inputting the maximum voltage to the A/D converter in the calibration mode is PFS_DATA and the digital signal in case of inputting the minimum voltage to the A/D converter is MFS_DATA and the number of gradations of a full scale is NUM_FS, the calibration data includes two factors α and β1, where α=NUM_FS/(PFS_DATA−MFS_DATA) and β1=(PFS_DATA+MFS_DATA)/2, and when the digital signal to be obtained in the normal mode is ADC_DATA, the digital calibration part is configured to generate a calibrated digital signal ADC_CAL based on ADC_CAL=(ADC_DATA−β1)×α.

4. The A/D conversion circuit of claim 1, wherein a middle voltage corresponding to a middle point between a maximum value and a minimum value of the digital signal is selectable as the calibration voltage, and
a digital signal in case of inputting the middle voltage to the A/D converter is stored in the non-volatile memory.

5. The A/D conversion circuit of claim 4, wherein, when the digital signal in case of inputting the middle voltage to the A/D converter in the calibration mode is MID_DATA and the number of gradations of a full scale is NUM_FS, the calibration data includes a factor β2, where β2=MID_DATA, and
the digital calibration part is configured to subtract the factor β2 from the digital signal ADC_DATA obtained in the normal mode.

6. The A/D conversion circuit of claim 1, wherein the A/D converter includes a ΔΣ A/D converter.

7. The A/D conversion circuit of claim 6, wherein the self-diagnosis circuit is configured to store an output signal from a quantizer of the ΔΣ A/D converter in the self-diagnosis mode into the non-volatile memory.

8. The A/D conversion circuit of claim 1, further comprising a timer circuit configured to generate a signal to trigger the self-diagnosis mode.

9. The A/D conversion circuit of claim 1, wherein the A/D conversion circuit is switched into the self-diagnosis mode in response to an external trigger signal.

10. The A/D conversion circuit of claim 1, wherein the self-diagnosis circuit is configured to write the digital signal obtained in the self-diagnosis mode in the non-volatile memory.

11. The A/D conversion circuit of claim 1, further comprising a variable gain amplifier whose gain is settable and which amplifies the output signal from the multiplexer.

12. The A/D conversion circuit of claim 1, wherein the analog signal and the calibration voltage are differential signals, and
the A/D converter is a differential type.

13. The A/D conversion circuit of claim 1, further comprising a calculation part configured to calculate the calibration data in the calibration mode.

14. The A/D conversion circuit of claim 1, wherein the A/D conversion circuit is integrated on a single semiconductor substrate.

15. An A/D conversion circuit, comprising:
- a reference voltage source configured to generate a predetermined calibration voltage;
- a multiplexer configured to receive an analog signal and the calibration voltage and output the analog signal selected in a normal mode and the calibration voltage selected in a calibration mode or a self-diagnosis mode;
- an A/D converter configured to convert an output signal from the multiplexer into a digital signal;
- a calculation part configured to calculate calibration data based on the digital signal in case of inputting the calibration voltage to the A/D converter in the calibration mode and the self-diagnosis mode;
- a non-volatile memory configured to hold the calibration data obtained in the calibration mode;
- a digital calibration part configured to calibrate the digital signal in case of inputting the analog signal to the A/D converter in the normal mode based on the calibration data; and
- a self-diagnosis circuit configured to diagnose the A/D converter based on the calibration data generated by the calculation part in the self-diagnosis mode and the calibration data stored in the non-volatile memory.

16. The A/D conversion circuit of claim 15, wherein two values of a maximum voltage corresponding to a maximum value of the digital signal and a minimum voltage corresponding to a minimum value of the digital signal are selectable as the calibration voltage.

17. The A/D conversion circuit of claim 15, wherein a middle voltage corresponding to a middle point between the maximum value and the minimum value of the digital signal is selectable as the calibration voltage.

* * * * *